United States Patent [19]

Burnham et al.

[11] Patent Number: 4,546,480
[45] Date of Patent: Oct. 8, 1985

[54] INJECTION LASERS WITH QUANTUM SIZE EFFECT TRANSPARENT WAVEGUIDING

[75] Inventors: Robert D. Burnham, Palo Alto; Donald R. Scifres, Los Altos; William Streifer, Palo Alto, all of Calif.

[73] Assignee: Xerox Corporation, Stamford, Conn.

[21] Appl. No.: 524,623

[22] Filed: Aug. 19, 1983

[51] Int. Cl.[4] .............................................. H01S 3/19
[52] U.S. Cl. ...................................... 372/45; 357/17; 372/46; 372/50
[58] Field of Search ....................... 372/44, 45, 46, 50; 357/17

[56] References Cited

U.S. PATENT DOCUMENTS 4,297,652 10/1981 Hayashi et al. ....................... 372/50

OTHER PUBLICATIONS

R. Dingle, et al., "Quantum States of Confined Carriers in Very Thin $Al_xGa_{1-x}As$-GaAs-$Al_xGa_{1-x}As$ Heterostructures", *Physical Review Letters*, vol. 33, No. 14, pp. 827–829, (Sep. 30, 1974).
R. D. Dupuis, et al., "Continuous 300° K. Laser Operation of Single-Quantum-Well $Al_xGa_{1-x}As$-GaAs Heterostructure Diodes Grown by Metalorganic Chemical Vapor Deposition", vol. 34, No. 4, pp. 265–267, (Feb. 15, 1979).
N. Holonyak, et al., "Phonon-Sideband MO-CVD Quantum-Well $Al_xGa_{1-x}As$-GaAs Heterostructure Laser", *Applied Physics Letters*, vol. 34, No. 8, pp. 502–505, (Apr. 15, 1979).
N. Holonyak, et al., "Alloy Clustering in $Al_xGa_{1-x}As$-GaAs Quantum-Well Heterostructures", *Physical Review Letters*, vol. 45, No. 21, pp. 1703–1706, (Nov. 24, 1980).
J. J. Coleman, et al., "High-Barrier Cluster-Free $Al_xGa_{1-x}As$-AlAs-GaAs Quantum-Well Heterostructure Laser", *Applied Physics Letters*, vol. 38, No. 2, pp. 63–65, (Jan. 15, 1981).
W. T. Tsang, "Device Characteristics of (AlGa)As Multiquantum Well Heterostructure Lasers Grown by Molecular Beam Epitaxy", *Applied Physics Letters*, vol. 38, No. 4, pp. 204–207, (Feb. 15, 1981).
H. O. Yonezu, et al., entitled "An AlGaAs Window Structure Laser", IEEE Journal of *Quantum Electronics*, vol. QE-15, No. 8, pp. 775–781, Aug. 1979.
*Xerox Disclosure Journal*, vol. 4, No. 5, p. 637, (Sep.-/Oct., 1979).
R. L. Hartman, et al., "The CW Elecro-Optical Properties of (Al,Ga)As Modified-Strip Buried Heterostructure Lasers", *Journal of Applied Physics*, vol. 51, No. 4, pp. 1909–1918, Apr. 1980.
W. T. Tsang, et al., "Current Injection GaAs-$Al_xGa_{1-x}As$ Multiquantum Well Heterostructure Lasers prepared by Molecular Beam Epitaxy", Applied Physics Letters, vol. 35, No. 9, pp. 673–675, (Nov. 1, 1979).
W. T. Tsang, et al., "Extremely Low Threshold (AlGa) As Modified Multiquantum Well Heterostructure Lasers Grown by Molecular Beam Epitaxy", Applied Physics Letters, vol, 39, No. 10, pp. 786–788, (Nov. 15, 1981).

*Primary Examiner*—James W. Davie
*Attorney, Agent, or Firm*—W. Douglas Carothers, Jr.

[57] ABSTRACT

An injection laser is provided with quantum size effect transparent waveguiding. The laser includes an active layer having an active region wherein carrier recombination occurs under lasing conditions. The active layer has passive waveguide end regions between the active region and the laser end facets that are sufficiently thin in layer thickness to form a transparent waveguide having a quantum well effect so that radiative recombination will not occur in these regions.

11 Claims, 7 Drawing Figures

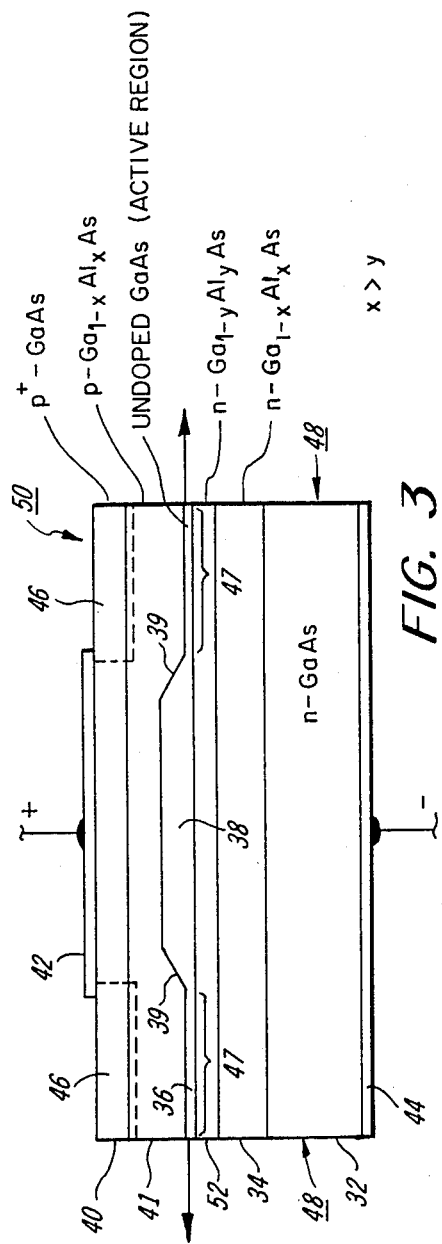
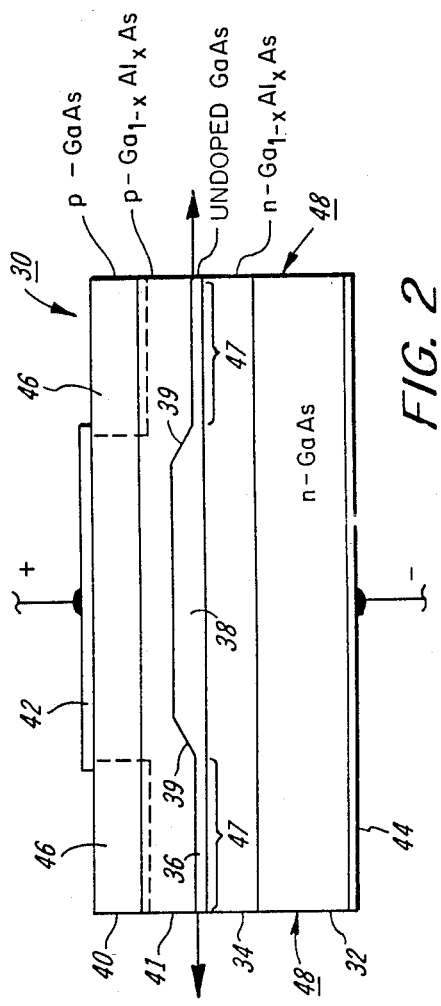
FIG. 3
FIG. 2

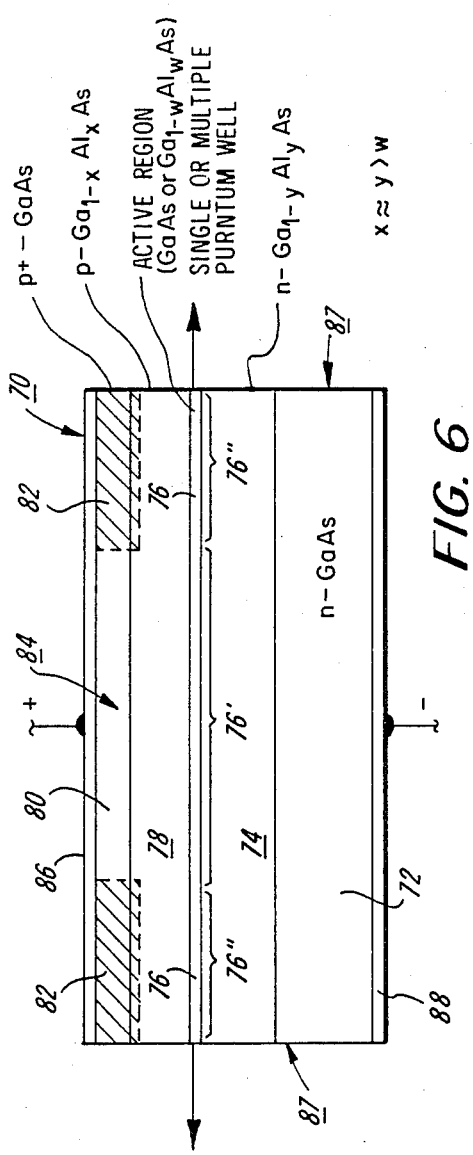
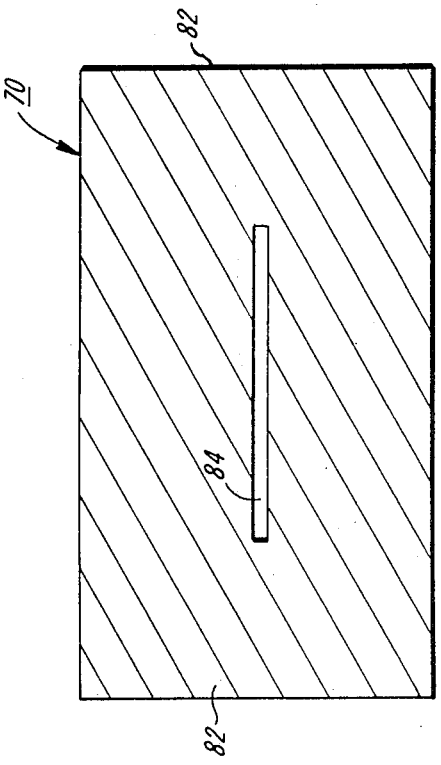
FIG. 6
FIG. 7

INJECTION LASERS WITH QUANTUM SIZE EFFECT TRANSPARENT WAVEGUIDING

BACKGROUND OF THE INVENTION

This is a continuation-in-part of patent application Ser. No. 327,136 filed Dec. 3, 1981, now abandoned. This invention relates to injection semiconductor lasers and in particular to such lasers with integral quantum size effect transparent or passive waveguiding in the active layer. These lasers may be of the quantum well type.

Quantum well heterostructure (QWH) lasers have attracted a large amount of interest in recent years because of the belief that quantum effects in the active regions of these lasers will provide improved operating characteristics in these lasers over the conventional double heterostructure injection lasers.

A QWH laser basically comprises a heterostructure device with an active region comprising a single layer or multiple layers comprising a series of very thin heterostructure layers of alternating materials having different bandgap and refractive index. In the case of GaAs/GaAlAs injection lasers, the quantum well active region comprises multiple alternate layers of $Al_xGa_{1-x}As$ and GaAs. In these heterostructures, the $Al_xGa_{1-x}As$ layers where x may be approximately 0.3 to 1.0, forms coupling barriers in the active region whereas the GaAs layers form wells. As an example, the size or thickness, $L_B$, of the barriers may be about 10 to 50 Å while the size or thickness, $L_Z$, of the wells may be about 30 Å to 50 Å, where $L_B$ and $L_Z$ are generally equal to or less than 50 Å but may be greater or less compared to one another.

The advantage of these quantum well lasers is by confining the carriers (holes and electrons) to very thin active layers, the energy level of the lowest energy states will be modified and raised to one or more steps above the band edge, i.e., to shift the lowest confined carrier transitions E, more above the energy gap $E_g$.

Recently, it has been demonstrated that phonon (LO) assistance is present in this state transition so that carriers have additional states to transfer to before recombining and producing radiation. These additional lower energy states are believed to be important in the radiation recombination emission from the QWH laser. Said in simpler terms, a phonon (LO) transition can assist in the recombination mechanism to make an indirect bandgap situation due to material difference function more like a direct bandgap phenomena.

Thus, QWH mechanism provides phonon assisted radiative recombination to scatter carriers (electrons) to lower energies before recombining to provide photons and stimulated lasing action. For background, see the Articles of R. Dingle et al, "Quantum States of Confined Carriers in Very Thin $Al_xGa_{1-x}As$-GaAs-$Al_xGa_{1-x}As$ Heterostructurs", *Physical Review Letters*, Vol. 33, No. 14 pp. 827–829 (Sept. 30, 1974); R. D. Dupuis et al, "Continuous 300K Laser Operation of Single-Quantum-Well $Al_xGa_{1-x}As$-GaAs Heterostructure Diodes Grown by Metalorganic Chemical Vapor Deposition", *Applied Physics Letters*, Vol. 34, No. 4 pp. 265–267 (Feb. 15, 1979); N. Holonyak et al, "Phonon-Sideband MO-CVD Quantum-Well $Al_xGa_{1-x}As$-GaAs Heterostructure Laser", *Applied Physics Letters*, Vol. 34, No. 8, pp. 502–505 (Apr. 15, 1979); N. Holonyak et al, "Alloy clustering in $Al_xGa_{1-x}As$-GaAs Quantum-Well Heterostructures, *Physical Review Letters*, Vol. 45 No. 21, pp. 1703–1706 (Nov. 24, 1980); J. J. Coleman et al, "High-Barrier Cluster-Free $Al_xGa_{1-x}As$-AlAs-GaAs Quantum-Well Heterostructure Laser", *Applied Physics Letters*, Vol. 38, No. 2 pp. 63–65 (Jan. 15, 1981); and W. T. Tsang, "Device Characteristics of (AlGa)As Multi-Quantum Well Heterostructure Lasers Grown by Molecular Beam Epitaxy" *Applied Physics Letters*, Vol. 38, No. 4, pp. 204–207 (Feb. 15, 1981).

There also has been interest in fabricating injection lasers that have active regions that couple into transparent waveguide structures in the device. Some of the reasons for this interest is to provide integral waveguides that are nonabsorbing to propagating radiation for efficient radiation coupling to other optical passive devices, to permit the spreading of radiation into the passive waveguide region which minimizes beam divergence and to confine laser pumped active regions away from the laser mirror facets to reduce facet degradation. Examples of this concept are disclosed in the paper of H. O. Yonezu et al entitled "An AlGaAs Window Structure Laser", *IEEE Journal of Quantum Electronics*, Vol. QE-15, No. 8, pp 775–781, August, 1979 and the *Xerox Disclosure Journal*, Vol. 4, No. 5, p 637 (September/October, 1979) and U.S. patent application Ser. No. 204,430 filed Nov. 6, 1980 now U.S. Pat. No. 4,371,966. This concept has been suggested for integration into the strip buried heterostructure laser [R. L. Hartman et al, "The CW Electro-Optical Properties of (Al,Ga)As Modified-Strip Buried Heterostructure Lasers", *Journal of Applied Physics*, Vol 51, No. 4, pp. 1909–1918, April 1980].

The conventional taper coupler is shown in the above-mentioned *Xerox Disclosure Journal*. In that structure, the active region of p-GaAs may be formed on the transparent waveguide layer of n-$Ga_9Al_1As$ by masking techniques as taught in U.S. patent application Ser. No. 231,556 filed Feb. 4, 1981, now U.S. Pat. No. 4,448,797.

Although the concept of taper coupling the active region into a transparent waveguide in such laser devices appears to be a most attractive technique for effective and efficient coupling between such an active region and a passive region or waveguide, there are several disadvantages. First, in the fabricating of such a laser device, it is necessary in the process, whether it be molecular beam epitaxy (MBE) or metalorganic chemical vapor deposition (MO-CVD), to introduce into the chamber or reactor the aperture mask to produce the active region midway through growth. These introduce the contamination which seriously effects the GaAlAs-GaAs interface. Aluminum is very reactive to oxygen and will combine with the exposed transparent waveguide layer providing defects.

Secondly, while the n-type $Ga_9Al_1As$ layer is a wider gap material than the p-type active region to serve as an efficient transparent waveguide and has some doping concentration in order to supply current to the active region, free carrier absorption in these transparent regions could be minimized if this waveguide layer was undoped or doped very lightly.

Third, the n-type transparent waveguide layer does not confine the injected carriers (holes) as desired because of the reduced potential barrier height. As a result, the laser current threshold will vary more rapidly with temperature variations.

The laser structures disclosed herein reduce or eliminate these disadvantages in the conventional tapered coupler heterostructure injection laser.

SUMMARY OF THE INVENTION

According to the present invention the wider bandgap transparent waveguide layer may be eliminated from conventional tapered coupler heterostructure lasers and providing an active layer in the regions where transparency is desired having an extremely small thickness (e.g., below 500 Å) so that quantized electron states are produced in the conduction and hole states in the valence band. The active layer may be defined as having two types of regions, the active region wherein current pumping is carried out to permit radiative recombination for support of radiation propagating under lasing conditions in a cavity established in the active layer between transverse end facets of the laser. The extremities of the active region fall short of the end facets so that unpumped regions of the active layer between the defined active region and the end facets function as a passive waveguide for the propagating radiation. The passive waveguide regions are sufficiently thin to appear transparent to the propagating radiation. The transparency occurs because the active layer in these regions is so thin that the band structure is changed because of the quantum size effect. When the electron states are quantized, radiation produced in the thicker active region will not be absorbed in the thinner active layer because of band structure change.

The defined active region may be thicker than the transparent or passive waveguide regions or may be of the same thickness, in which case the active region would also have the quantum size effect. In either case, the active layer may be a single or multiple quantum well.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 2 is a schematic side view of a heterostructure injection laser in accordance with this invention;

FIG. 3 is a schematic side view of another embodiment of a heterostructure injection laser in accordance with this invention;

FIG. 6 is a schematic view of a further embodiment of a heterostructure injection laser in accordance with this invention; and FIG. 7 is a top view of the laser shown in FIG. 6 with the metalization contact removed.

DESCRIPTION OF THE PREFERRED EMBODIMENTS

Figure 1:
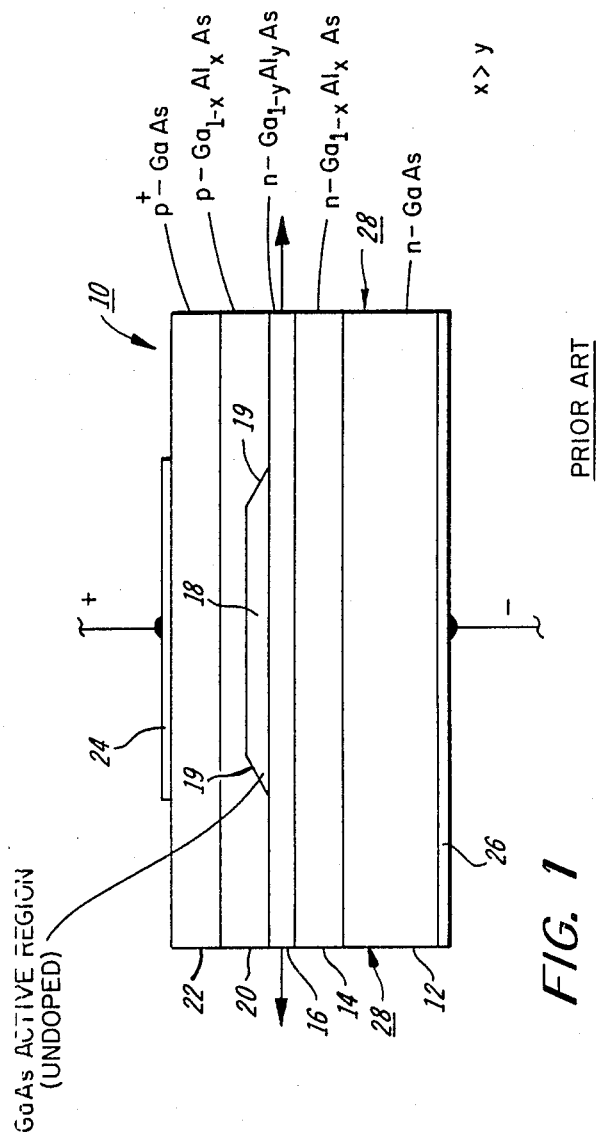
FIG. 1 is a schematic side view of a heterostructure injection laser in accordance with the prior art.

Reference is first made to FIG. 1 which discloses a conventional tapered coupler heterostructure injection laser 10 previously referenced and known in the art.

Laser 10 comprises a plurality of consecutively deposited semiconductor layers, for example, of GaAs and GaAlAs of varying doping levels, thicknesses and composition. Substrate 12 may be n-GaAs. Cladding layer 14 is n-$Ga_{1-x}Al_xAs$ (e.g., x=.4), transparent or passive layer n-$Ga_{1-y}Al_yAs$ (e.g., y=0.1), active region 18 p,n or undoped GaAs, cladding layer 20 of p-$Ga_{1-x}Al_xAs$ (e.g., x=0.4) and contact layer 22 of p or p+- GaAs. The tapered couplers 19 couple radiation produced in the active region 18 into the wider bandgap waveguide layer 16. The metal contact 24 on layer 22 only covers the region to be pumped, i.e., the active region 18. The bottom equalization 26 comprises the other electrode. No radiative recombination will occur due to current injection in the regions of the waveguide layer 16 beyond the active region 28 thereby reducing undesirable erosion and degradation at the end facet 28. However, there are the disadvantages as previously alluded to in the Background relative to use of wider bandgap transparent waveguide layer 16. These disadvantages become transparent by the injection laser structures of FIGS. 2-5.

In FIG. 2, the heterostructure injection laser 30 comprises the substrate 32 upon which is consecutively deposited by a selected fabricating process (e.g., MBE or MO-CVD) the cladding layer 34 of n-$Ga_{1-x}Al_xAs$, the active layer 36 with the active region 38 of undoped or very slightly doped (e.g., $3 \times 10^{17}$) quality, the cladding layer 41 of p-$Ga_{1-x}Al_xAs$ and the content layer 40 or P+-GaAs. The appropriate metal contacts 42 and 44 are provided for forward biasing laser 30. Ion or proton implanted regions 46 may be provided for current confinement enhancement. Upon forward biasing of laser 30, carrier recombination occurs in active region 38 and radiation induced in this region is taper coupled at 39 into thin active layer regions 47 of the active layer 36. Thus, an optical cavity is established between end facets 48 for the propagating radiation.

The primary difference between injection laser 30 and injection laser 10 is that the active regions 47 are extremely thin, i.e., they are sufficiently thin to provide the quantization of electron states so that radiative recombination cannot occur. The thin regions 47 form a quantum well. They raise the effective band edge of the crystal so that an electron is not permitted to transfer to the bottom of the well but can only stay in some higher energy state. The radiation produced in the active region will couple into the thin regions 47 because, even though this coupling may be somewhat weak, regions 47 are still the highest bandgap regions of the laser, next to region 38. The coupled radiation in regions 47 experiences transparency due to band structure change caused by the quantum size effect. When the electron states are quantized, radiation produced in the active region 38 will not be absorbed in the thinner quantum well regions 47 because of the band structure change. The energy state in the quantum well regions 47 is not sufficient to cause any excitation to the propagating radiation. As a result, there will be no radiation absorption in regions 47.

The preferred thickness of the active region 38 may be approximately 500 Å to 10,000 Å while the thickness of the quantum well regions 47 may be approximately 5 Å to 500 Å, preferably about 50 Å to 200 Å. The molar fraction, x, for example, may be approximately 0.3 to 1.0.

While only the side view of laser structure is being shown for the purposes of illustrating the invention, it should be noted that it is intended that the active layer 36 may be of a two dimensional character, i.e., regions 38 and 47 extend for the full width of the laser device, or may be of three dimensional character, i.e., regions 38 and 47 comprise a strip completely confined on all sides by wider bandgap material as exemplified in U.S. patent application Ser. No. 204,430 filed Nov. 6, 1980, now U.S. Pat. No. 4,371,966.

The epitaxial growth procedure for laser 30, as well as other lasers to be discussed, is as follows for two dimensional character. Epitaxial growth proceeds up to and including a very thin active layer. For example, in MOCVD processing, and after deposition of layer 34, a very thin layer of about 50 Å of undoped GaAs is deposited on layer 34. Next, a mask having an elongated aperture is positioned on the thin active layer and the growth of layer 36 is continued. The mask is provided with an inner channel or chamber so that while the epitaxial deposition of region 38 proceeds, the tapered coupler regions 39 are formed due to the mask aperture geometry in accordance with the teachings of U.S. patent application Ser. No. 231,556 filed Feb. 4, 1981. During the growth of layer 36, the aluminum containing layer 34 is not contaminated because it is protected by previously deposited 50 Å thin GaAs layer.

For laser structures of the three dimensional character, the epitaxial growth procedure outlined in U.S. Pat. No. 4,371,966 may be followed. The thin initially grown active layer may have a thickness of about 400 Å. Continued growth of the active layer is achieved as previously explained until an active region 38 of about 1000 Å in thickness is produced. The active strip is formed by selective etching.

Laser 50 in FIG. 3 is identical to laser 30 in FIG. 2 except for the additional transparent waveguide layer 52. Layer 52 is lightly doped ($3 \times 10^{17}$) and may be comprised of n-$Ga_{1-y}Al_yAs$. Layer 52 functions also as a transparent waveguide to the propagating radiation. Layer 52 provides for taper coupling into a large transparent waveguide comprising the combination of regions 47 and layer 52 for enhanced waveguiding and low beam divergence.

An alternative to the inclusion of waveguiding layer 52 would be to provide a transverse graded doping profile through cladding layer 34 so that the upper regions of this layer have a lighter doping profile as compared to its lower regions.

Figure 4:
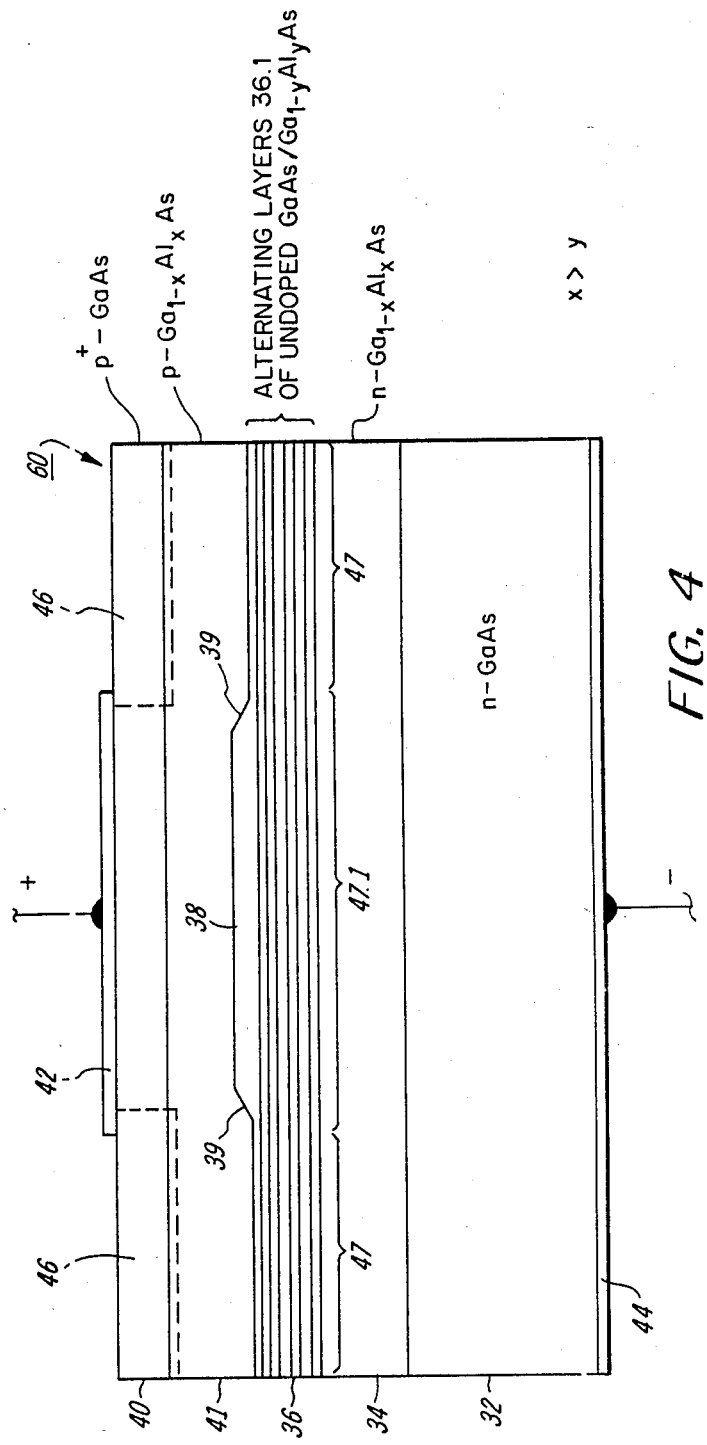
FIG. 4 is a schematic side view of a still further embodiment of a heterostructure injection laser in accordance with this invention.
Figure 5:
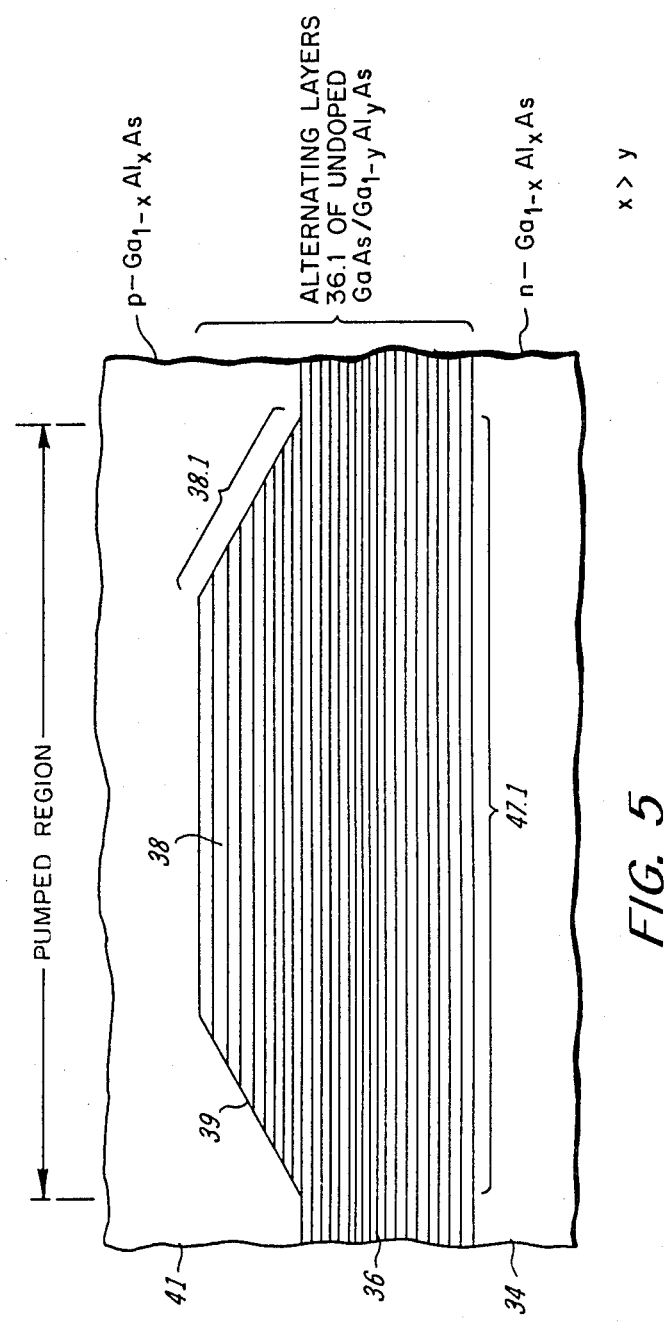
FIG. 5 is a schematic side view of a modified form of the active region of the injection laser shown in FIG. 4.

The injection laser according to this invention may also have an active layer comprising of multiple quantum well passive regions. In FIG. 4, the laser 60 is identical to laser 30 in FIG. 2 except for the quantum well structure in active layer 36 comprising alternating layers 36.1 of undoped GaAs/$Ga_{1-y}Al_yAs$. Layers 36.1 may, for example, be each about 40 Å and 50 Å thick. Regions 47 comprise multiquantum well unpumped regions while the combination of active region 38 and the adjacent multiquantum well region 47.1 are pumped to provide carrier recombination under lasing conditions. In FIG. 5, the active region of laser 60 has been modified to comprise alternating layers 38.1 of undoped GaAs/GaAlAs, which together with region 47.1 form the active cavity region for laser 60. The quantum well layers 38 in the active region 38 preferably have a little larger thickness (e.g., 50 Å) compared to layers 36.1 (e.g., 40 Å) to ensure that the waveguide regions 47 are most transparent to the propagating radiation.

In order to guard against any wave leakage of the propagating radiation in the lasers according to this invention, it is important that there is symmetry in the refractive index of cladding layers 34 and 41. A 3% or more difference in the refractive index in these layers may force the wave out of the thin waveguiding region 47. This would not be so much of a problem for laser 50 since the transparent waveguide is much thicker. In matching the index of the layers, both the Al content and doping concentration must be taken into consideration since they are of different conductivity type.

Previous embodiments have dealt principally with single or multiple quantum well active layer structure wherein the active layer 36, for example, comprises centrally located thicker active region 38 with thin passive waveguide regions 48 formed between the end of the active region 38 but coupled thereto and end facets 48 of the laser. The regions 47 are sufficiently thin to provide a quantum size effect so that radiative recombination does not occur in these regions and, therefore these regions function as transparent windows. The active region 38 also may be sufficiently thin to also function as a single and multiple quantum well structure. This type of embodiment is illustrated in FIGS. 6 and 7.

Laser 70 comprises a plurality of consecutively deposited semiconductor layers deposited on substrate 72 of n-GaAs. These layers, for example, may consecutively comprise cladding layer 74 of n-$Ga_{1-y}Al_yAs$ (e.g., y=0.2–0.4), active region 76 comprising either a single quantum well layer of undoped, p-type or n-type GaAs or $Ga_{1-w}Al_wAs$ (e.g., w=0.1–0.5) having a thickness in the range of 100 Å to 500 Å, or several quantum well layers of undoped, p-type or n-type alternating layers of GaAs each in the range of about 40 Å to 90 Å thick and $Ga_{1-w}Al_wAs$ (e.g., w=0.3–0.4) each in the range of about 50 Å to 150 Å thick, cladding layer 78 of p-$Ga_{1-x}Al_xAs$ (e.g., x=0.2–0.4) and contact layer 80 of p+-GaAs.

While region 76 is illustrated as a two dimensional layer of layers, region 76 could be formed as a three dimensional cavity as known by those skilled in the solid state laser art.

As best illustrated in FIG. 7 (metallization contact 86 not shown), contact layer 80 is ion or proton implanted to the depth of cladding layer 78, as indicated by the cross hatched area 82. With selective masking prior to implantment, a stripe 84 is formed in layer 80. Due to the electrically irrative effect of the implant 82 stripe 84 represents current confinement means to pump a similar area $76^1$ in quantum well region 76 to permit radative recombination to occur in this region. For purposes of current pumping, a metalization contact 86 is formed on the implanted surface of contact layer 80 and metalization contact 88 is formed on the bottom surface of substrate 72.

While pumping of area $76^1$ of laser 70 will permit radiative recombination therein, radative recombination will not occur in areas $76''$ within the optical cavity established between transverse end facets 87 of the laser. This is due to implant 82 that does not permit current pumping to reach the vicinity of facets 87.

The main principal behind the operation of lasers 30, 50, 60 and 70 is that at least a portion of the thin active region of the layers in the vicinity of the laser facet exhibit the quantum size effect and also have the prominence of producing phonon assisted recombination which means that the active regions would be transparent or passive to the radiation created by the laser itself if that radiation is produced by phonon assisted recombination. In other words, lasers operating by phonon assisted recombination produce their own transparent waveguide. Enhanced phonon assisted recombination is dependent upon the number, composition doping or doping levels and thickness of the quantum well or wells of the active region.

The selective proton implant 82 of laser 70 in FIG. 6, for example maintains the waveguide established for propagating radiation transparent all to the end facets 87. To achieve this totally, it is important to eliminate non-radiative recombination (heating) at the vicinity of the end facets. This is accomplished by eliminating the possibility of current flow at the end facet regions. While the invention has been described in conjunction with specific embodiments, it is evident that many alternatives, modifications and variations will be apparent to those skilled in the art in light of the foregoing description.

For example, other known composition/alloy systems may be used instead of GaAs/GaAlAs, for example, (GaIn)(AsP). DFB or DBR laser structures may be incorporated. The thin active region/quantum well active layer may be incorporated in curved lasers or waveguides or in laser arrays formed on a single substrate. Additional wider bandgap layers may be added to both sides of the thin region/quantum well active layer to form a large optical cavity region. The large optical cavity region could be index graded so as to have a bandgap variation. The active region could be made very short in accordance with the teachings of U.S. Patent Application Ser. No. 338,455, filed Jan. 8, 1982, now U.S. Pat. No. 4,461,007. The periodic quantum well layers of FIGS. 4 and 5 would be designed with specific composition and layer thickness to optimize current threshold and longitudinal and fundamental transverse modes of operation.

Also, the current conducting stripe contact 42 could alternatively extend to the facets 48 of the laser rather than terminate over the active region as shown in the figures.

Accordingly, it is intended to embrace all such alternatives, modifications, and variations as fall within the spirit and scope of the appended claims.

What is claimed is:

1. In an injection laser comprising a plurality of contiguous semiconductor layers deposited on a substrate, one of said layers being an active layer and having a lower bandgap and higher index of refraction relative to at least cladding layers immediately adjacent to said active layer, said active layer having an active region to permit radiative recombination and support radiation propagating under lasing conditions in a cavity established between transverse end facets of the laser, means incorporated into said laser to confine current to said active region, the extremities of said active region falling short of said end facets so that the regions of said active layer between said active region and said end facets function as a passive waveguide for the propagating radiation, said passive waveguide regions of said active layer being sufficiently thin in layer thickness to form a transparent waveguide having a quantum well effect so that radiative recombination will not occur in these regions.

2. In the injection laser of claim 1 wherein said active layer is a single quantum well structure of uniform thickness.

3. In the injection laser of claim 2 wherein said active layer has a thickness in the range of about 100Å to 500 Å.

4. In the injection laser of claim 1 wherein said active layer comprises a multiple quantum well structure.

5. In the injection laser of claim 1 wherein said active region is of thicker cross-section than said passive waveguide regions.

6. In the injection laser of claim 5 wherein said active region has a thickness in the range of about 500 Å to 10,000 Å and said passive waveguide regions of said active layer have a thickness in the range of about 5 Å to 500 Å.

7. In the injection laser of claim 6 wherein said passive waveguide regions of said active layer have a preferred thickness in the range of about 50 Å to 200 Å.

8. In the injection laser of claim 1 wherein said passive waveguide regions are multiple quantum well waveguide regions.

9. In the injection laser of claim 8 wherein said quantum well passive waveguide regions comprise alternating layers of undoped $GaAs/Ga_{1-y}Al_yAs$, each of said layers being in the range of about 40 Å to 50 Å thick.

10. In the injection laser of claim 8 wherein said active region also comprise a multiple quantum well active region.

11. In the injection laser of claim 10 wherein said multiple quantum well passive waveguide regions and said multiple quantum well active region comprise alternating layers of undoped $GaAs/Ga_{1-y}Al_yAs$, the thickness of the well layers comprising a portion of said active region being larger than the thickness of the well layers of said passive waveguide regions.

* * * * *